United States Patent
Saly et al.

(10) Patent No.: US 10,699,897 B2
(45) Date of Patent: Jun. 30, 2020

(54) ACETYLIDE-BASED SILICON PRECURSORS AND THEIR USE AS ALD/CVD PRECURSORS

(71) Applicant: Applied Materials, Inc., Santa Clara, CA (US)

(72) Inventors: Mark Saly, Santa Clara, CA (US); Bhaskar Jyoti Bhuyan, San Jose, CA (US); Jeffrey W. Anthis, San Jose, CA (US); Feng Q. Liu, San Jose, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 418 days.

(21) Appl. No.: 15/413,956

(22) Filed: Jan. 24, 2017

(65) Prior Publication Data

US 2017/0213726 A1  Jul. 27, 2017

Related U.S. Application Data

(60) Provisional application No. 62/286,409, filed on Jan. 24, 2016.

(51) Int. Cl.
| | | |
|---|---|---|
| *H01L 21/02* | (2006.01) | |
| *C23C 16/30* | (2006.01) | |
| *C23C 16/455* | (2006.01) | |
| *C23C 16/40* | (2006.01) | |
| *C23C 16/32* | (2006.01) | |
| *C23C 16/34* | (2006.01) | |
| *C23C 16/36* | (2006.01) | |

(52) U.S. Cl.
CPC ...... *H01L 21/02208* (2013.01); *C23C 16/308* (2013.01); *C23C 16/325* (2013.01); *C23C 16/345* (2013.01); *C23C 16/36* (2013.01); *C23C 16/401* (2013.01); *C23C 16/402* (2013.01); *C23C 16/45531* (2013.01); *C23C 16/45536* (2013.01); *C23C 16/45542* (2013.01); *C23C 16/45553* (2013.01); *H01L 21/0214* (2013.01); *H01L 21/0217* (2013.01); *H01L 21/0228* (2013.01); *H01L 21/0262* (2013.01); *H01L 21/02126* (2013.01); *H01L 21/02142* (2013.01); *H01L 21/02164* (2013.01); *H01L 21/02167* (2013.01); *H01L 21/02271* (2013.01); *H01L 21/02274* (2013.01); *H01L 21/02447* (2013.01); *H01L 21/02529* (2013.01)

(58) Field of Classification Search
CPC .......... H01L 21/02208–02219; H01L 21/02266–0228; H01L 21/02447–0245; H01L 21/02529–02532; H01L 21/0262; H01L 21/02123–0217; C23C 16/308; C23C 16/325; C23C 16/345; C23C 16/401; C23C 16/402; C23C 16/45536–45542; C23C 16/45553

See application file for complete search history.

(56) References Cited

U.S. PATENT DOCUMENTS

| | | | | |
|---|---|---|---|---|
| 5,663,269 | A * | 9/1997 | Chu ................. | B29C 70/84 522/40 |
| 6,326,506 | B1 * | 12/2001 | Tachikawa ............ | C07F 7/0829 549/215 |
| 6,410,462 | B1 * | 6/2002 | Yang .................... | C23C 16/401 438/788 |
| 7,097,878 | B1 * | 8/2006 | Rulkens ................ | C23C 16/045 427/255.11 |
| 7,294,583 | B1 * | 11/2007 | Rulkens ............ | H01L 21/31612 438/778 |
| 7,858,525 | B2 | 12/2010 | Dominguez et al. | |
| 7,906,174 | B1 * | 3/2011 | Wu ........................ | C23C 16/401 427/248.1 |
| 9,786,491 | B2 * | 10/2017 | Suzuki ............. | H01L 21/02216 |
| 2002/0142579 | A1 * | 10/2002 | Vincent ............. | H01L 21/02131 438/623 |
| 2005/0238889 | A1 | 10/2005 | Iwamoto et al. | |
| 2008/0085610 | A1 * | 4/2008 | Wang .................... | C23C 16/401 438/785 |
| 2008/0237861 | A1 | 10/2008 | Dominguez et al. | |
| 2010/0102452 | A1 * | 4/2010 | Nakao ................ | H01L 21/76834 257/773 |
| 2012/0122302 | A1 * | 5/2012 | Weidman ............... | C23C 16/325 438/478 |
| 2013/0022745 | A1 * | 1/2013 | Dussarrat ................ | C23C 16/24 427/255.28 |
| 2014/0030510 | A1 * | 1/2014 | Kimura ................... | C23C 14/10 428/336 |
| 2014/0273528 | A1 * | 9/2014 | Niskanen ............ | H01L 21/0217 438/792 |

(Continued)

OTHER PUBLICATIONS

Kaloyeros et al.—Low Temperature Metal Organic Chemical Vapor Deposition of Electronic Materials; Materials Research Society Symposium Proceedings (1990), 162 (Diamond, Silicon Carbide Relat. Wide Bandgap Semicond.), pp. 409-414 (Year: 1990).*
Geyer, Florian L., et al., "Synthesis and Structure of Tetraethynylsilane and its Silylated Derivatives", Chem. Eur. J. 2014, 20, pp. 3600-3605.

Primary Examiner — Zandra V Smith
Assistant Examiner — Jeremy J Joy
(74) Attorney, Agent, or Firm — Servilla Whitney LLC

(57) ABSTRACT

Provided are acetylide-based compounds and methods of making the same. Also provided are methods of using said compounds in film deposition processes to deposit films comprising silicon. Certain methods comprise exposing a substrate surface to a acetylide-based precursor and a reactant in various combinations.

14 Claims, No Drawings

(56) References Cited

U.S. PATENT DOCUMENTS

| | | | |
|---|---|---|---|
| 2015/0140833 A1* | 5/2015 | Thadani | H01L 21/02219 438/762 |
| 2015/0162191 A1* | 6/2015 | Saly | H01L 21/02211 438/780 |
| 2016/0122573 A1* | 5/2016 | Uprety | C09D 133/08 428/217 |
| 2017/0175262 A1* | 6/2017 | Kawada | H01L 21/02576 |

* cited by examiner

ACETYLIDE-BASED SILICON PRECURSORS AND THEIR USE AS ALD/CVD PRECURSORS

CROSS-REFERENCE TO RELATED APPLICATIONS

This application claims priority to U.S. Provisional Application No. 62/286,409, filed Jan. 24, 2016, the entire disclosure of which is hereby incorporated by reference herein.

TECHNICAL FIELD

The present disclosure relates generally to methods of depositing thin films. In particular, the disclosure relate to acetylide containing silicon compounds and their use as precursors for ALD/CVD processes.

BACKGROUND

SiC is a promising material for power electronic devices. SiC is harder than Si, sustains a higher voltage, is a better charge carrier and can withstand very high temperature. SiC is also etch resistant towards HF or $O_2/O_3$ plasma processes. Therefore, SiC finds the potential application as a silicon and carbon source for a low-k spacer.

Presently, SiC is deposited by CVD at >1000° C. using silane as a Si source and lower alkane/alkenes such as ethylene or propane as a C source. Very high temperature and low pressure (~100 mbar) is required to crack these molecules to grow SiC films. High temperature CVD process of SiC is one of the biggest disadvantages in the modern electronics industry as most of the integration processes have lower thermal budgets (>500° C.).

Therefore, there is a need for new precursors and methods for the deposition of SiC by ALD or CVD at lower temperature.

SUMMARY

One or more embodiments of the disclosure are directed to methods of depositing a silicon-containing film. The methods comprise exposing a substrate surface to a silicon precursor and a reactant. The silicon precursor has the general formula $SiX_{4-n}A_n$ where each X is independently a halide, alkyl, amine, hydrogen or combination thereof, A is an acetylide and n is 1 to 4.

Additional embodiments of the disclosure are directed to methods of depositing a silicon-containing film. The methods comprise sequentially exposing a substrate surface to a silicon precursor and a reactant, where the silicon precursor is $SiA_4$, where A is an acetylide.

Further embodiments of the disclosure are directed to methods of depositing a silicon-containing film. The methods comprise positioning a substrate having a surface in a processing chamber. Exposing the surface of the substrate to a silicon precursor comprising a compound having the formula $SiX_{4-n}A_n$ where each X is independently a halide, alkyl, amine, hydrogen or combination thereof, A is an acetylide and n is 1 to 4. Unreacted silicon precursor is removed from the surface of the substrate. The surface of the substrate is exposed to a reactant comprising a plasma including a nitrogen-containing species to form a SiCN film on the surface of the substrate. The substrate is maintained at a temperature of less than or equal to about 400° C.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways. It is also to be understood that the complexes and ligands of the present disclosure may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

One or more embodiments of the disclosure are directed to ALD/CVD precursors which can enable the growth or deposition of SiC, SiCN, SiCO and SiCON films at lower temperatures. The inventors have found that acetylide containing silicon compounds of the general formula $SiX_{4-n}A_n$, where A is an acetylide and n is 1 to 4, can be used to deposit various materials using atomic layer deposition (ALD) and/or chemical vapor deposition (CVD) processes.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. In one or more embodiments, the substrate surface is terminated with —OH, —NH$_2$, or —NH functionality.

Embodiments of the disclosure relate to acetylide containing silicon compounds of the general class of Equation I, II or III as precursors for ALD/CVD processes.

$$SiX_{4-n}A_n \qquad (I)$$

where each X is independently a halide, alkyl, amine, hydrogen or combination thereof, A is acetylide and n=1-4.

Some specific compounds of the class of Equation (I) include, but are not limited to:

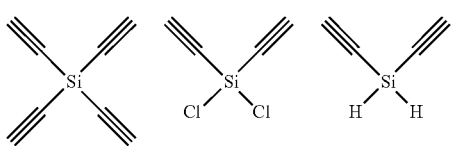

In some embodiments, the acetylide precursor comprises one or more of $SiA_4$, $SiA_3Cl$, $SiA_2Cl_2$, $SiACl_3$, $SiA_3H$, $SiAH_3$ or $SiA_2H_2$. In some embodiments, the halide is chlorine, bromine or iodine. In some embodiments, there are substantially no fluorine atoms. As used in this regard, the term "substantially no fluorine atoms" means there is less than 1 atomic % fluorine based on the total halide content. In some embodiments, the halide consists essentially of molecular chlorine, molecular bromine and/or molecular iodine. As used in this manner, the term "consists essentially of" means that the stated species comprises greater than or equal to about 90%, 95%, 98% or 99% of the reactive species.

The acetylide precursors of some embodiments incorporate high levels of C (>20%) with low levels of hydrogen. It is believed that this is due to the high C/Si ratios and low hydrogen content. Additionally, the presence of highly acidic acetylene protons are believed to allow for facile reactions at the substrate surfaces leading to sufficient saturation.

In some embodiments, the disclosed precursors may undergo reactions with metal (M) containing compounds to form materials such as MSi, MC and MSiC. Metal precursors could also be used as catalysts at low temperature to form films such as SiC, which previously has not been accomplished below 400° C.

One or more of the embodiments described herein advantageously provide for the deposition of a silicon-containing film at relatively low temperatures (e.g., below 500° C.). Some embodiments of the disclosure advantageously provide methods to deposit films such as SiC at temperatures below about 400° C.

Silicon dioxide deposited at temperatures below 500° C. suffer from high wet etch rate ratios (WERR) due to the high hydrogen content. One or more embodiments of the disclosure advantageously provide methods of depositing $SiO_2$ or SiOC with low hydrogen content.

Accordingly, one or more embodiments of the disclosure are directed to methods of depositing a silicon-containing film. A substrate having a surface is positioned in a processing chamber. A substrate surface is exposed to a silicon precursor and a reactant. The exposure to the silicon precursor and the reactant can occur at the same time or sequentially. In a CVD reaction, the silicon precursor and the reactant are mixed in the gas phase and allowed to react with the substrate surface. In some embodiments, the method comprises a chemical vapor deposition (CVD) process. As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors. In one or more embodiments, any co-reagent is added with any one or more of the reactants.

In one or more embodiments, the method comprises an atomic layer deposition (ALD) process. As used herein, "atomic layer deposition" refers to a process in which a substrate surface is exposed to alternate or sequential flows of a precursor and/or reagent. That is, the precursor and/or reagents may be flowed and/or exposed to the substrate surface sequentially or substantially sequentially. As used herein "substantially sequentially" refers to where the flows of the precursor and/or reagents do not overlap for a majority of the flow. In an ALD process, the silicon precursor and the reactant are sequentially exposed to the substrate surface. The reacts with the substrate surface leaving a silicon species on the substrate. The reactant is able to react with the silicon species on the surface to produce the final silicon-containing film. There is substantially no gas phase mixing of the silicon precursor and the reactant in an ALD process.

In one or more embodiments, the reactant comprises a plasma comprising a species that does not become a part of the final film. For example, an argon plasma may provide sufficient energy to react with the silicon precursor to form a silicon carbide film. There are substantially no argon atoms in the final film, meaning that there is less than 1 atomic % argon atoms (or other inert atoms) in the film. In some embodiments, the plasma comprises one or more of Ar, He, Ne, Kr or Xe.

In some embodiments, the reactant comprises a nitrogen-containing species. The nitrogen-containing species is able to react with the silicon precursor to produce a silicon-containing film comprising one or more of SiN or SiCN. In some embodiments, the nitrogen-containing species comprises one or more of $NH_3$, hydrazine or $N_2$. In one or more embodiments, the reactant comprises a plasma. The plasma of some embodiments comprises the nitrogen-containing species. The plasma power, frequency, temperature or pressure can be adjusted to control the amount of nitrogen and carbon atoms in the silicon-containing film.

In some embodiments, the reactant comprises an oxygen-containing species. The oxygen-containing species is able to react with the silicon precursor to produce a silicon-containing film comprising one or more of SiO, SiCO or SiCON. Suitable oxygen-containing species include but are not limited to CO, $CO_2$, $O_2$, $H_2O$ or $O_3$. In some embodiments, the reactant comprises a plasma including the oxygen-containing species. The plasma power, frequency, temperature or pressure can be adjusted to control the atomic amounts of carbon, oxygen and nitrogen.

In some embodiments, the reactant comprises a metal precursor. The metal precursor species can react with the silicon precursor, in the gas phase or on the substrate surface, to form a film comprising one or more of MSi, MC or MSiC, where M is a metal. Suitable metals include, but are not limited to, Ti, Ta, Hf, W and/or Ru.

In some embodiments, the metal precursor acts as a catalyst to form a SiC film at temperatures below about 500° C. As a catalyst, the metal precursor does not form a substantial amount of the film composition (i.e., less than 1 atomic percent).

Reactants may be selected depending upon the predetermined film composition. In one or more embodiments, the reactant acts as a precursor for additional atoms. For example, in some embodiments, a film comprising silicon oxide ($SiO_2$) may be deposited using a reactant comprising an oxidant. In one or more embodiments, the oxidant comprises gaseous oxygen ($O_2$), ozone ($O_3$) or water ($H_2O$). In other embodiments, films comprising silicon nitride (SiN) may be deposited using a reactant comprising a nitrogen precursor. In one or more embodiments, the nitrogen precursor comprises ammonia ($NH_3$), hydrazine ($N_2H_4$) or an amine. In other embodiments, a boron precursor may be used to provide silicon boride (SiB) films. In yet other embodiments, a carbon precursor may be used to produce films comprising silicon carbide (SiC). Some reactants may act as precursors for more than one atom. In some embodiments, more than one reactant is used, wherein each reactant deposits one type of atom. For example, a film comprising silicon, carbon and nitrogen (SiCN) may be deposited using carbon sources (e.g., alkane) as well as nitrogen sources (e.g., ammonia, hydrazine, etc.).

In one or more embodiments, the acetylide-based molecule is vaporized into a reaction chamber and the reactant gas is co-flowed to form a silicon containing film. Purges may be used after first, second and/or third precursors are flowed into the processing chamber. That is, the substrate and chamber may be exposed to a purge step after stopping the flow of the given precursor gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen.

The reaction conditions for the reaction will be selected based on the properties of the film precursors and substrate surface, and any co-reagents. The deposition may be carried out at atmospheric pressure, but may also be carried out at reduced pressure. The vapor pressure of any co-reagents should be low enough to be practical in such applications. The substrate temperature should be low enough to keep the bonds of the substrate surface intact and to prevent thermal decomposition of gaseous reactants. However, the substrate temperature should also be high enough to keep the film precursors in the gaseous phase and to provide sufficient energy for surface reactions. The specific temperature depends on the specific substrate, film precursors, and catalyst used and pressure. The properties of the specific substrate, film precursors, and catalyst may be evaluated using methods known in the art, allowing selection of appropriate temperature and pressure for the reaction.

In one or more embodiments, the deposition is carried out at a temperature in the range of about 23° C. to about 550° C. In some embodiments, the deposition is carries out at a temperature less than or equal to about 500° C., 450° C., 400° C., 350° C., 300° C., 250° C., 200° C., 150° C., 125° C., or 100° C.

Examples

Synthesis and Reactivity of Silicon Tetra-Acetylide (SiA$_4$):

Silicon tetra-acetylide was synthesized following a modification of a procedure described in ref *Chem. Eur. J.* 2014, 20, 3600. 11.87 mL (84 mmol) of Me$_3$SiCCH was dissolved in 250 mL dry hexane in a Schlenk flask. The solution was cooled to −78° C. under inert atmosphere and 52.5 mL (84 mmol) solution of 1.6 M nBuLi was added to it over 15 min using a cannula. The reaction mixture was allowed to attain room temperature and stirred for 1 h. In another Schlenk flask, 2.30 mL (20 mmol) of SiCl$_4$ was dissolved in 50 mL dry hexane. The SiCl$_4$ solution was added dropwise to ice cold LiCCSiMe$_3$ solution over a period of 20 min. The reaction mixture was allowed to attain room temperature and was slowly and stirred for 16 h. A white precipitate of LiCl was started forming immediately after adding SiCl$_4$. The solution was filtered under N$_2$ atmosphere and the solvent was concentrated till formation of crystals was observed. The Schlenk flask was sealed and kept at 4° C. for 6 hours for complete formation of crystals. Crystals were filtered and washed two times with ice cooled hexane. Yield: 7.10 g (85%). $^1$HNMR (400.18 MHz, CDCl$_3$) 0.21 ppm; $^{13}$CNMR (100.64 MHz, CDCl$_3$) 117.16, 104.08, −0.38 ppm. Elemental analysis: calc for C$_{12}$H$_{36}$Si$_5$: C=57.62%, H=8.50%; observed C=56.00%, H=9.31%.

4.16 g (10 mmol) of Si(CCSiMe$_3$)$_4$ was dissolved in 30 mL dry pentane in a Schlenk flask covered carefully with aluminum foil so that light could not penetrate in to the solution. To it, 3.71 mL (42 mmol) triflic acid (CF$_3$SO$_3$H) was added dropwise over a period of 5 min. Reaction mixture was stirred under light protection and inert atmosphere for 30 min. 50 mL of pentane was added to the reaction mixture and washed 5 times with saturated NaCl solution. The organic layer was collected and dried on dry sodium sulphate. The solution was concentrated to 30 mL and then kept at −30° C. for 2 h. The solution was further cooled down to −78° C., upon which formation of crystals were observed. The liquid portion was syringed out and crystals were washed three times with pentane at −78° C. Yield: 0.83 g (65%). $^1$HNMR (400.18 MHz, CDCl$_3$) 2.65 ppm; $^{13}$CNMR (100.64 MHz, CDCl$_3$) 96.39, 80.40 ppm. Elemental analysis: calc for C$_8$H$_4$Si: C=72.72%, H=3.03%; observed C=73.36%, H=2.91%.

To test the precursors reactivity towards Si—Cl species, a solution phase reaction was performed where one equivalents of silicon acetylide was reacted with SiCl$_4$. It was observed that the acetylene proton peak at 2.65 ppm disappeared after addition of SiCl$_4$. When silicon chloride was added to silicon acetylide at room temperature, a precipitate was observed. TGA of the reaction mixture showed that there was a residual mass of >62%, till 350° C. This indicated that SiCl$_4$ reacted with silicon acetylide to form some non-volatile SiC based compound.

Chemical Vapor Deposition of SiC

The silicon acetylide precursor (SiA$_4$) can be used in many ways to produce thin films of SiC or SiCN. Initial deposition data confirmed that conformal SiC films were grown using silicon acetylide with a GPC of 1.4 nm/cycle. XPS analysis of the film after Ar sputtering confirmed the presence of Si and C in the film at a Si:C ratio of 1:8. The CVD growth of SiC was performed at a substrate temperature of 380° C. with a chamber pressure of 11 torr.

Atomic Layer Deposition of SiCN

SiA$_4$ was used to grow SiCN and SiN films using NH$_3$. It was found that the carbon and nitrogen content of the film could be tuned by changing the plasma conditions. The ALD growth of SiCN films was performed at a substrate temperature of 380° C. with a chamber pressure of 4.5 torr. A plasma was formed with a frequency of 13.56 MHz and power of 300 watt/5 seconds.

In some embodiments, one or more layers may be formed during a plasma enhanced atomic layer deposition (PEALD) process, although the relatively high reactivity of the precursors described herein generally do not require the assistance of a plasma-based process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa. Use of the terms "expose to a substrate surface" and "flow" is intended to encompass both processes.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a silicon-containing film, the method comprising:
exposing a substrate surface to a silicon precursor and a reactant, the silicon precursor having the general formula $SiX_{4-n}A_n$ where each X is independently a halide, alkyl, amine, hydrogen or combination thereof, A is an acetylide and n is 1 to 4;
reacting the silicon precursor with the substrate surface to form a silicon species on the substrate surface; and
reacting the silicon species on the substrate surface with the reactant, the reactant comprising a nitrogen-containing species or an oxygen-containing species and the silicon-containing film comprising one or more of SiCN, SiCO or SiCON, wherein the silicon-containing film has a carbon content greater than 20%.

2. The method of claim 1, wherein the silicon precursor comprises one or more of $SiA_4$, $SiA_3Cl$, $SiA_2Cl_2$, $SiACl_3$ or $SiA_2H_2$.

3. The method of claim 1, wherein the nitrogen-containing species comprises one or more of $NH_3$, hydrazine, or $N_2$.

4. The method of claim 1, wherein the reactant comprises a plasma.

5. The method of claim 4, further comprising changing one or more of plasma power, pressure, or temperature to change an amount of nitrogen or carbon in the silicon-containing film.

6. The method of claim 1, wherein the oxygen-containing species comprises one or more of CO, $CO_2$, $O_2$, $H_2O$ or $O_3$.

7. The method of claim 1, wherein the substrate surface is maintained at a temperature of less than or equal to about 400° C.

8. The method of claim 1, further comprising utilizing a metal precursor as a catalyst to form the silicon-containing film at a temperature below about 500° C.

9. The method of claim 1, wherein the silicon precursor comprises >20% carbon.

10. A method of depositing a silicon-containing film, the method comprising:
exposing a substrate surface to a silicon precursor and a reactant, the silicon precursor having the general formula $SiX_{4-n}A_n$ where each X is independently a halide, alkyl, amine, hydrogen or combination thereof, A is an acetylide and n is 1 to 4;
reacting the substrate surface with the silicon precursor and the reactant, the reactant comprising a metal precursor and the silicon-containing film comprising one or more of MC or MSiC, wherein the silicon-containing film has a carbon content greater than 20%.

11. The method of claim 10, wherein the silicon precursor comprises one or more of $SiA_4$, $SiA_3Cl$, $SiA_2Cl_2$, $SiACl_3$ or $SiA_2H_2$.

12. The method of claim 10, wherein the silicon precursor and the reactant are mixed in the gas phase and reacted with the substrate surface.

13. The method of claim 10, wherein the silicon precursor and the reactant are reacted with the substrate surface sequentially such that there is no gas phase mixing of the silicon precursor and the reactant.

14. The method of claim 10, further comprising utilizing a metal precursor as a catalyst to form the silicon-containing film at a temperature below about 500° C.

* * * * *